(12) United States Patent
Joly et al.

(10) Patent No.: US 6,197,695 B1
(45) Date of Patent: Mar. 6, 2001

(54) PROCESS FOR THE MANUFACTURE OF PASSIVE AND ACTIVE COMPONENTS ON THE SAME INSULATING SUBSTRATE

(75) Inventors: Jean-Pierre Joly, Saint Egreve; Bernard Aspar, Rives; Béatrice Biasse, Uriage; Marc Zussy, Grenoble, all of (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 09/419,303

(22) Filed: Oct. 15, 1999

(30) Foreign Application Priority Data

Oct. 20, 1998 (FR) .................................................. 98 13136

(51) Int. Cl.$^7$ ................................................. H01L 21/311
(52) U.S. Cl. ............................. 438/694; 438/906; 438/974
(58) Field of Search ................................. 438/690, 691, 438/692, 694, 406, 906, 974

(56) References Cited

U.S. PATENT DOCUMENTS

| | | | |
|---|---|---|---|
| 4,793,181 | * 12/1988 | Djorup | 73/336.5 |
| 5,134,094 | * 7/1992 | Schovanec | 437/209 |
| 5,276,345 | * 1/1994 | Siegel et al. | 257/352 |
| 5,468,672 | * 11/1995 | Rosvold | 437/60 |
| 5,996,411 | * 12/1999 | Leonardson et al. | 73/514.29 |

FOREIGN PATENT DOCUMENTS 0 168 815    1/1986 (EP) .

OTHER PUBLICATIONS

Joachim N. Burghartz, et al., "Integrated RF and Microwave Components in BiCMOS Technology," *IEEE Transactions on Electron Devices*, vol. 43, No. 9, Sep. 1996.

Maurice H. Hanes, et al., "MICROX$^{201}$ —An All–Silicon Technology for Monolithic Microwave Integrated Circuits," *IEEE Electron Device Letters*, vol. 14, No .5, May 1993.

Chushirou Kusano, Ph.D., et al., "High–Frequency Semiconductor Devices for Mobile Telecommunication Systems," *Hitachi Review*, vol. 46 (1997), No. 1.

* cited by examiner

Primary Examiner—Benjamin L. Utech
Assistant Examiner—Kin-chan Chen
(74) Attorney, Agent, or Firm—Burns, Doane, Swecker & Mathis, LLP (57) ABSTRACT

This invention relates to a process for the manufacture of one electronic structure comprising at least one active component and at least one passive component or element on a support substrate made of an insulating material. A characteristic process comprises the following steps:

- make the active component in a surface layer made of semiconducting material from an initial substrate comprising a wafer of semiconducting material supporting the said surface layer,
- make electrical insulation areas capable of insulating the passive component or element from the active component,
- make the passive component or element on and/or in the electrical insulation areas,
- prepare the surface of the initial substrate face with the said electronic structure to make this face compatible for bonding with another substrate by molecular bonding,
- perform the bonding, the other substrate being the said support substrate made of an insulating material,
- eliminate all or part of the wafer of semiconducting material.

32 Claims, 7 Drawing Sheets

PROCESS FOR THE MANUFACTURE OF PASSIVE AND ACTIVE COMPONENTS ON THE SAME INSULATING SUBSTRATE

TECHNICAL FIELD

This invention relates to a process for the manufacture of passive and active components on the same insulating substrate. It is particularly applicable to the manufacture of hyperfrequency circuits and particularly integrated hyperfrequency components called "Monolithic Microwave Integrated Circuits" (MMIC), comprising integrated active components (transistors) and passive components (for example inductors).

STATE OF PRIOR ART

Hyperfrequency circuits are composed of active components (for example transistors) and passive components or elements (for example resistors, capacitors, inductors, and conducting lines). The performances of these circuits in terms of speed and gain are related to the performances of active components (speed, gain, voltage withstand, etc.), and also to losses in passive components. Hyperfrequency circuits can be made in two different ways:
  1) either from passive and active elements made separately and assembled in hybrid modules,
  2) or monolithically. In this case passive elements are drawn and made in the form of metallic lines on the same semiconducting substrate as the substrate in which the active elements are made.

In the second case, losses in passive elements are much higher due to the conductivity of the semiconducting substrate.

A good substrate for hyperfrequency components is actually an insulating substrate with a low dielectric constant. It is important to keep passive elements as far away as possible from any conducting material. However, it is impossible to obtain perfectly insulating silicon substrates. This is one of the reasons why preference is given to other semiconductors such as AsGa which can itself be semi-insulating, for the production of high performance hyperfrequency components.

However, the use of the semiconducting materials other than silicon is not satisfactory for two reasons:
  the manufacture of components then become significantly more expensive;
  an attempt is increasingly made to assemble all hyperfrequency analog components (reception, transmission, modulation, amplification), and the control and logical processing part (base band) on the same chip, particularly for portable electronic equipment (see the article entitled "High-Frequency Semiconductor Devices for Mobile Telecommunication Systems" by C. KUSANO et al., Hitachi Review Vol. 46, 1997, No. 1). These are referred to as "mixed mode ICs" (see U.S. Pat. No. 5,492,857). Silicon is the preferred material for the manufacture of logic circuits. It is still the only material that can be considered for these logic functions and will remain so for many years. Adding hyperfrequency functions onto the same silicon chip would require that loss problems in passive elements related to the non-zero conductivity of the silicon substrate would have to be solved, and also the coupling problem between hyperfrequency parts and logic parts of the circuit, also due to the conducting substrate, would have to be solved. These couplings induce disturbances that can be harmful to the logic signals. Therefore, there are no mixed mode ICs on the market at the present time.

Therefore, hyperfrequency circuits are made on specific chips, either on GaAs, or on silicon.

Several solutions have been proposed to reduce the negative effect of the silicon substrate.

A first solution consists of using SOI (Silicon On Insulator) type substrates. These structures are particularly attractive for the logic part of mixed mode ICs (lower consumption). However, they provide a very imperfect solution to the problem of losses in the substrate, which remains more or less conducting silicon. The use of high resistivity "area fusion" type silicon was proposed (see the article "MICROX™—An All-Silicon Technology for Monolithic Microwave Integrated Circuits" by M. H. HANES et al., IEEE Electron Device Letters, Vol. 14, No. 5, May 1993, pages 219–221), but this type of substrate is expensive and cannot be used for diameters greater than 150 mm, and in any case it does not completely eliminate losses.

A second solution consists of using Silicon On Sapphire (SOS) type substrates, as is divulged in U.S. Pat. No. 5,492,857. SOS substrates are made by a heteroepitaxy of silicon on a monocrystalline corundum ($Al_2O_3$) substrate which is an insulator. In this case, as in the case of SOI, the active components are made in a thin silicon surface layer and are insulated from each other by local elimination of the silicon layer. Passive components can then be made by metallizations located adjacent to active components. The fact that the substrate is perfectly insulating can give very low losses for these passive components. Hyperfrequency circuits were made on substrates with very interesting results. Nevertheless, these substrates have serious disadvantages. They are expensive and difficult to manipulate in device manufacturing lines and require special processes. Furthermore, the crystalline quality of the epitaxied silicon layer is not very good.

A third solution consists of using conventional (massive) silicon substrates with a special design for passive elements on several metallization layers and separation of the metallic layers forming the passive elements by thick insulation layers (see the article entitled "Integrated RF and Microwave Components in BiCMOS Technology", J. N. BURGHARTZ et al., IEEE Transactions on Electron Devices, Vol. 43, No. 9, Sep. 1996, pages 1559–1570). This solution is not satisfactory either, because the effect of the conducting substrate is still significant although it is reduced. As in the case of the SOI substrate, it may be necessary to use the high resistivity area fusion type silicon substrate.

DESCRIPTION OF THE INVENTION

In order to overcome the problems mentioned above, this invention proposes an innovative technique for making electronic circuits comprising active components, and passive components and/or elements. This technique is particularly applicable to making hyperfrequency circuits.

Therefore, the purpose of the invention is a process for the manufacture of at least one electronic structure comprising at least one active component and at least one passive component or element on a support substrate made of an insulating material, characterized in that it comprises the following steps.
  make the active component in a surface layer made of semiconducting material from an initial substrate comprising a wafer of semiconducting material supporting the said surface layer,
  make electrical insulation areas capable of insulating the passive component or element from the active component, make the passive component or element on and/or in the electrical insulation areas, prepare the surface of the initial substrate face with the said electronic structure to make this face compatible for bonding with another substrate by molecular bonding, perform the said bonding, the other substrate being the said support substrate made of an insulating material, eliminate all or part of the wafer of semiconducting material.

The initial substrate may also comprise an insulating layer between the wafer made of semiconducting material and the surface layer.

Electrical insulation areas may be obtained by eliminating the surface layer, except for the area in which the said active component is formed, and by replacing it by a dielectric material. They may also be obtained by oxidation of the surface layer, except for the area in which the said active component is formed. They may also be obtained by bombardment of the surface layer by particles, except for the area in which the said active component is formed, this bombardment by particles making the semiconducting material insulating.

Production of the electrical insulation areas may include the formation of an insulating layer.

Advantageously, the passive component or element is made by deposition and photolitho-etching of the metallic layer.

Surface preparation may include the deposition of a planarization layer on the said face to be bonded, followed by polishing this planarization layer.

The bonding step may be achieved by choosing the support substrate among quartz, silicon, glass and sapphire substrates.

All or part of the wafer of semiconducting material may be eliminated using one of the following methods, or a combination of them: grinding, selective chemical etching, polishing, cleavage caused by coalescence following a heat treatment of micro-cavities generated by ionic implantation.

The process described above provides components which are upside down compared with conventional processes. However, components in the normal direction can be made according to this invention.

This can be done according to another purpose of the invention, which is a process for the manufacture of at least one electronic structure comprising at least one active component and at least one passive component or element on a support substrate made of an insulating material, characterized in that it comprises the following steps:

make the active component in a surface layer made of semiconducting material from an initial substrate comprising a wafer of semiconducting material supporting the said surface layer.

make electrical insulation areas capable of insulating the passive component or element from the active component:

make the passive component or element on and/or in the electrical insulation areas, bond the face of the initial substrate with the said electronic structure with a first add-on substrate, eliminate all or part of the wafer of semiconducting material from the initial substrate, prepare the surface of the wafer of semiconducting material exposed during the elimination step to make this face compatible for molecular bonding with a second add-on substrate, perform the said bonding of the exposed face with the second add-on substrate made of an insulating material, eliminate the first add-on substrate.

The initial substrate may also comprise an insulating layer between the wafer made of a semiconducting material and the surface layer.

The electrical insulation areas may be obtained in the same way as described above. The same is true for making the passive element and for eliminating all or part of the semiconducting material wafer.

The surface preparation may include the deposition of a planarization layer on the said exposed face, followed by polishing of this planarization layer.

The step in which the exposed face is bonded may be carried out choosing a quartz, silicon, glass or sapphire substrate as the second substrate.

The first add on substrate may be eliminated according to one of the following methods, or a combination of these methods : straigntening, selective chemical etching, polishing, cleavage caused by coalescence following a heat treatment of micro-cavities generated by ionic implantation.

BRIEF DESCRIPTION OF THE DRAWINGS

The invention will be better understood and other advantages and specific features will become clear after reading the following description given as a non-limitative example, accompanied by the attached drawings among which.

DETAILED DESCRIPTION OF EMBODIMENTS OF THE INVENTION

Molecular bond requires that there are no dielectric materials present other than conventional mineral materials used in microelectronics (mainly silica $S_iO_2$). This is necessary to ensure the reliability of circuits (no mechanical and electrical degradation either during the rest of the manufacturing process, or while the component is being used). Furthermore for MMIC circuits, polymers (although they are usually good insulators) are not necessarily free of high frequency loss phenomena.

Molecular bond between two substrates (or direct bonding) requires matching between three parameters, namely surface planeness, substrate stiffness (related to the thickness and mechanical elasticity coefficients), and bonding energy (related to molecular chemical bonds formed between the two surfaces).

The deposition of a layer of mineral material, for example silica, on the surface of a circuit made in a substrate, gives good molecular bond due to the water molecules adsorption phenomenon. Silica is particularly suitable for forming this layer.

In the lack of a particular treatment, the surface condition of a silica type dielectric layer deposited at the end of manufacturing a component is not sufficient for good molecular bond without macroscopic faults (unbonded areas, or even total lack of bonding). Therefore, it is advantageous to respect the following procedures:

deposition of a silica type layer at the end of the process, with a thickness greater than a threshold value depending on the residual topology of the circuit before this step. The deposition must be as conform as possible, so that it fills the grooves created by previous patterns in the subjacent layers, as much as possible, make this layer plane, for example using a polishing technique such as mechanical-chemical polishing. The quantity of material removed during this step should be adapted to the topology presented after the deposition of the mineral layer, so that a sufficiently plane surface is obtained at all levels at the end of polishing. In particular, planeness must be sufficiently good compared with the stiffness of the substrate comprising the circuit, at the time of bonding, cleaning and particular chemical processing, with the purpose of removing the remaining particles and inducing the maximum chemical bonds favorable to molecular bond (high bonding energy).

Before bonding, it is very useful to prepare the surface of the reception substrate so that it also has the necessary characteristics for molecular bonding. Some glass or silica substrates are particularly suitable for molecular bonding (good planeness and surface chemical bonds).

Direct bonding may then be obtained simply by bringing into contact (propagation of a bonding wave). Annealing may be carried out at the maximum temperature allowable for circuit elements before eliminating the semiconducting substrate, in order to reinforce bonding forces as much as possible.

All these operations may be done on machines frequently used in micro-electronics.

According to this invention, passive components may be made on electrical insulation areas between active components and are therefore used on a fully insulating substrate, therefore without any losses. Quality factors of resonators made in this way are significantly improved. Therefore, the characteristics of the circuit are better, particularly compared with prior art which used bonding by polymer glues.

FIGS. 1A to 1G illustrate a first embodiment of the invention. For simplification reasons, the electronic structure to be produced will only comprise a single active component and a passive element.

Figure 1A:
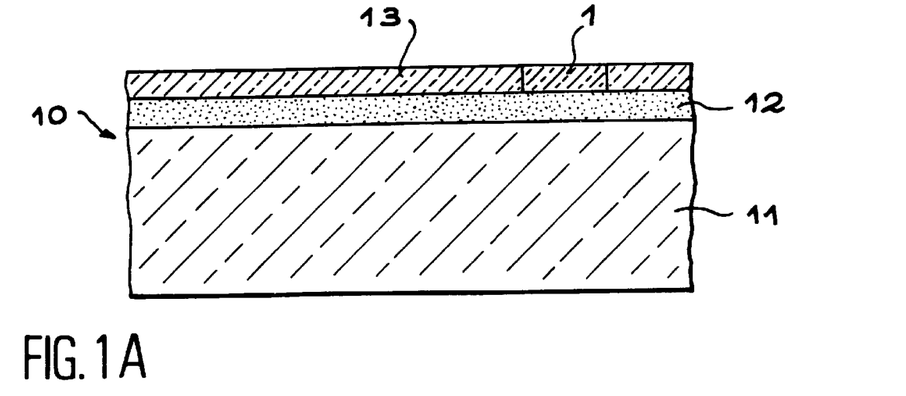
FIGS. 1A, 1B, 1C, 1D, 1E, 1F, and 1G show the different steps in a first embodiment of, this invention.

FIG. 1A shows a transverse view, as an example, of an SOI substrate 10 composed of a silicon wafer 11 covered with a silicon oxide layer 12, itself covered with a surface silicon layer 13. An active component 1, for example a transistor, is made in the surface layer 13, by a method known to those skilled in the art.

Figure 1B:
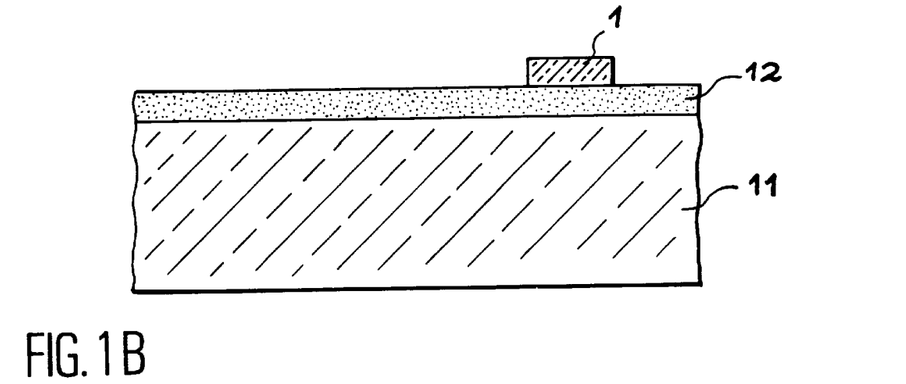

The lateral insulation of active component 1 is made by entirely eliminating the surface layer of silicon except for the area making up the active component. This elimination may be achieved by etching continued as far as the oxide layer 12 after masking the active component 1, as shown in FIG. 1B.

Figure 1C:
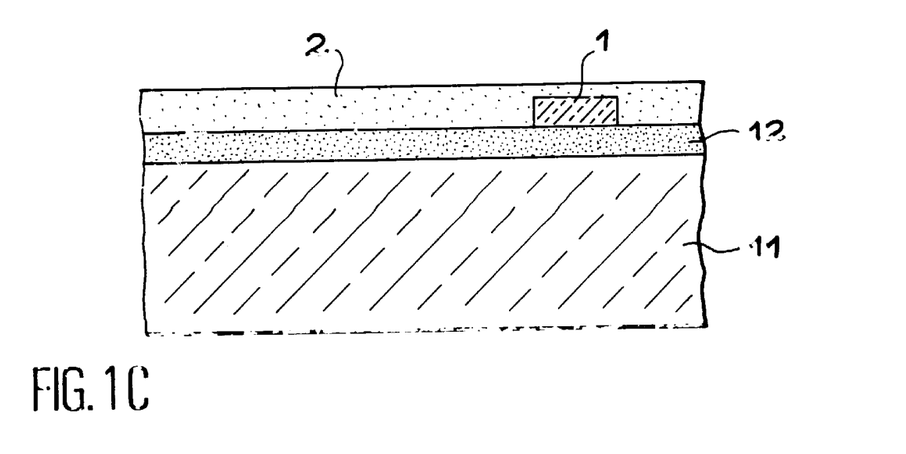

A layer of dielectric material 2 is then deposited on the oxide layer 12, surrounding the active component 1 as shown in FIG. 1C. The passive element 3, electrically connected to the active component 2, is made on the layer of dielectric material 2 by deposition and photolitho-etching of the metallic layer (see FIG. 1D).

Figure 1D:
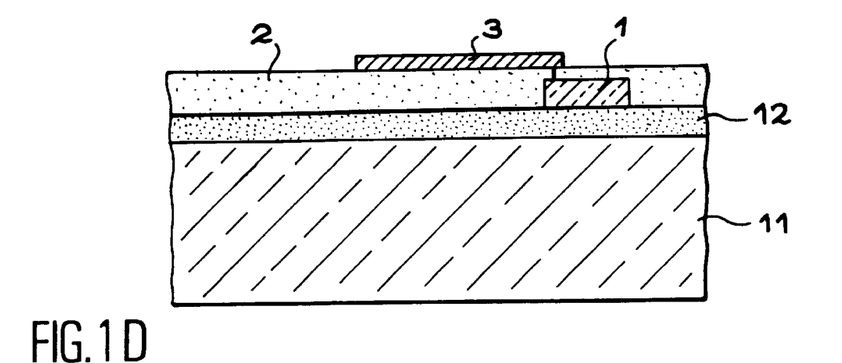
Figure 1E:
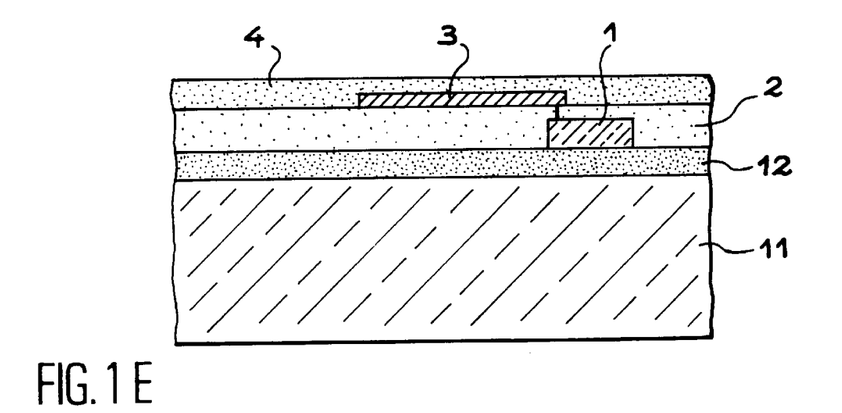

The upper face of the stacked structure as shown in FIG. 1D is then prepared to make it compatible for bonding with another substrate. For example, the structure may be made plane, for example by depositing a layer of silica 4 on the face concerned (see FIG. 1E), then polishing this silica layer 4 by mechanical-chemical polishing using standard processes used in micro-electronics.

Figure 1F:
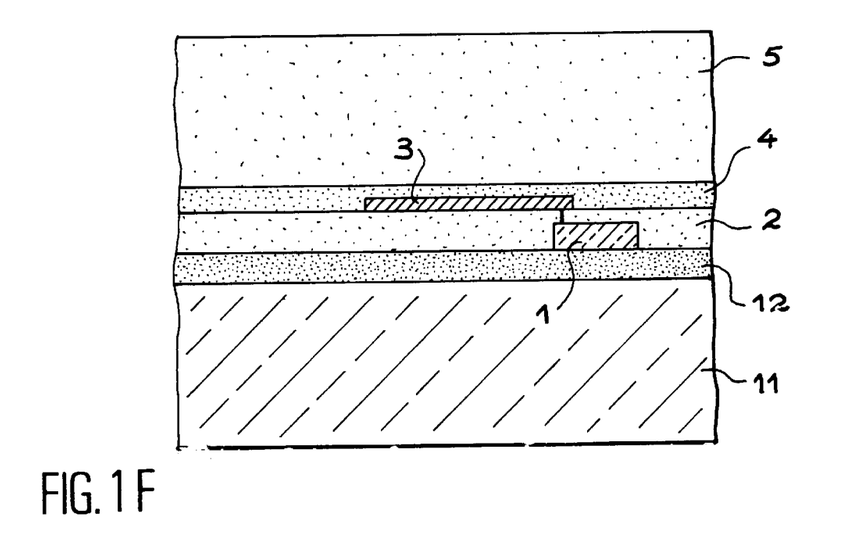

The upper face of the silica layer 4 is then bonded onto a substrate made of an insulating material 5 (see FIG. 1F). The substrate 5 may advantageously be made of quartz, silica, glass or sapphire. For molecular bonding, the surfaces of the elements to be bonded are treated appropriately. Making these surfaces plane is an essential criterion to obtain good bonding. It may be useful to apply heat treatment to the bonding interface, in order to increase the mechanical strength of molecular bonding. This heat treatment must be compatible with the previously produced electronic components.

The silicon wafer 11 on the SOI substrate is then eliminated. This may be done using several techniques either separately or in combination, namely grinding, selective chemical etching, polishing, and stopping on the silica layer 12. The technique divulged by document FR-A-2 681 472 may also be used. In doing this, the SOI substrate should previously have been treated by ionic implantation to form a layer of micro-cavities along a cleavage plan. The silicon wafer may be eliminated during the last step in the process according to this invention, using a heat treatment enabling coalescence of the micro-cavities.

Figure 1G:
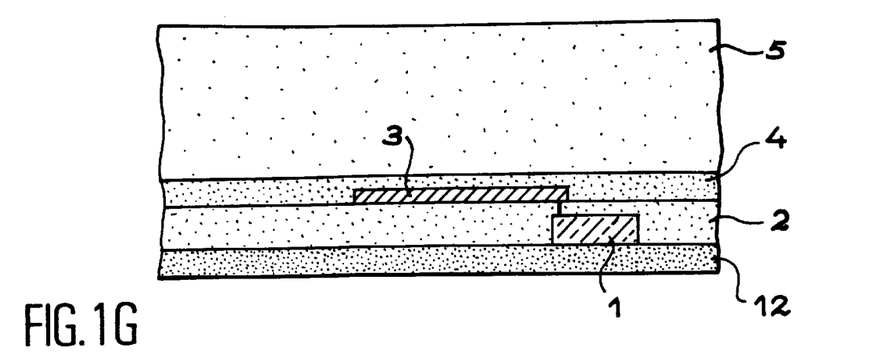

The finally obtained structure is as shown in FIG. 1G. The next step is to open the insulating layers 12 and 2 at the connection pins, using known techniques. In this embodiment, the semiconducting material in areas of the surface layer away from the active component was eliminated by etching the surface layer of silicon and by deposition of a layer of dielectric material. An insulating material can be obtained away from the active component by other methods. For example, the silicon surrounding the active component may be oxidized locally, and the passive component or element may be made on this oxidized silicon layer. Another solution for obtaining an insulating material away from the active component would consist of bombarding the surface layer by particles, for example an ionic implantation could be performed. Therefore, the surface silicon layer is kept everywhere. Areas of silicon located under passive components (or elements) are bombarded by ions in order to make the silicon insulating (creation of defects—carrier traps). The dose and bombardment energy are calibrated to give good resistivity of the surface layer throughout its entire thickness. This bombardment operation must be carried out after any high temperature heat treatment that could otherwise "anneal" the defects deliberately created in the silicon by bombardment. This technique for electrical insulation is easy to implement and it has the advantage that it does not modify the planeness of the structure.

With the first embodiment of the invention, components are presented upside down compared with the normal direction. The second embodiment which will now be described with reference to FIGS. 2A to 2D produces components in the normal direction.

The first steps in the second embodiment are identical to the first steps in the first mode described above, and therefore will not be described. Therefore, it is assumed that there is a structure like that shown in FIG. 1E.

Figure 2A:
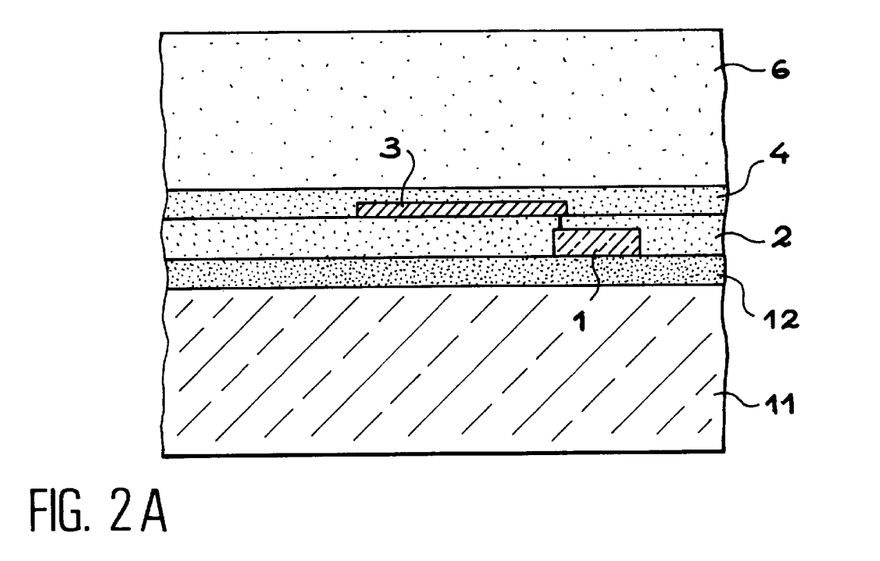
FIGS. 2A, 2B, 2C, and 2D show the different steps in a second embodiment of the invention.

FIG. 2A shows the structure during preparation and comprising a substrate 6 bonded on the silica layer 4. This substrate 6 may be arbitrary and not necessarily insulating. Bonding may be done by molecular bonding.

Figure 2B:
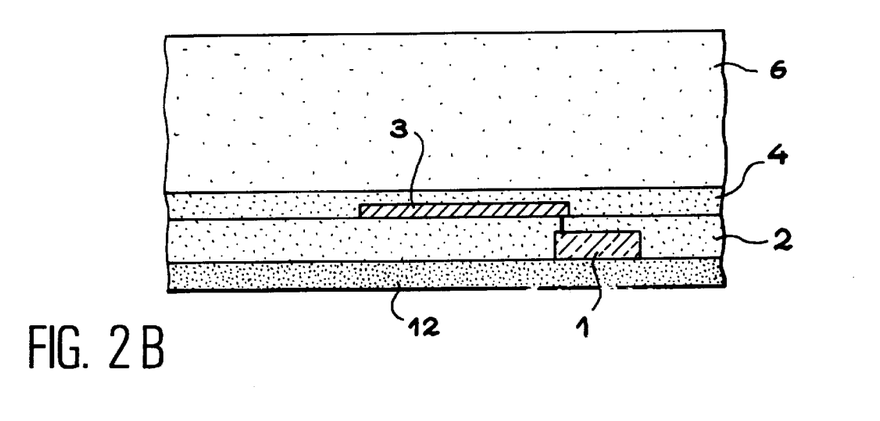

FIG. 2B shows the structure after the silicon wafer has been eliminated from the SOI substrate. This wafer may be eliminated using techniques described for the first embodiment.

Figure 2C:
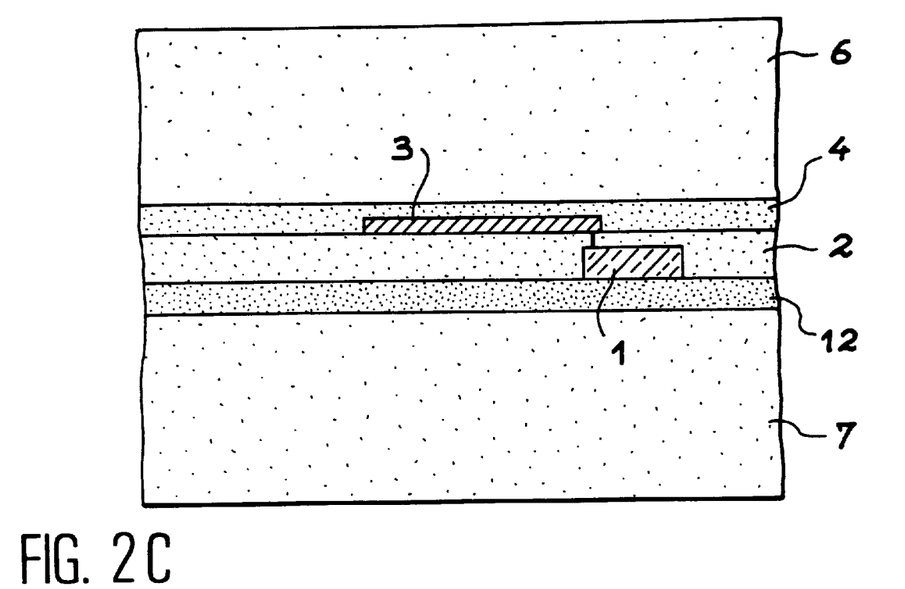
Figure 2D:
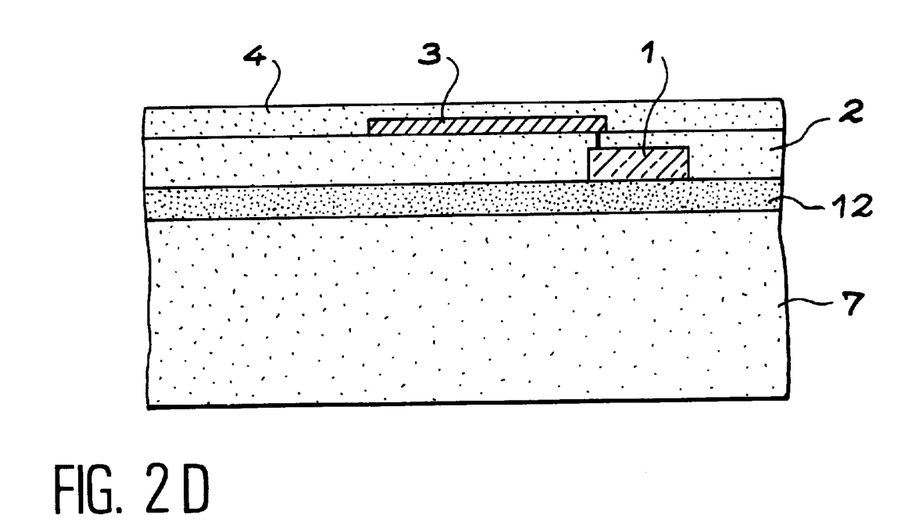

The resulting structure is then bonded by the silica layer 12 to its support substrate made of an insulating material 7 as shown in FIG. 2C. Bonding is done by molecular bonding, the faces to be bonded on layer 12 and substrate 7 having been prepared accordingly.

Substrate 6 is then eliminated by one of the techniques mentioned above, and the structure shown in FIG. 2D is obtained in which the components are in the normal direction.

A third embodiment of the invention will now be described with reference to FIGS. 3A to 3E. According to this embodiment, the components are in the upside down direction compared with the normal direction.

The starting point is a solid substrate 20, for example made of silicon. An active component 21 (see FIG. 3A) is made in the surface layer of the substrate 20 starting from face 22. Face 22 is then covered with a layer 23 of dielectric material that also covers the active component 21 (see FIG. 3B). The passive element 24, electrically connected to the active component 21, is then made on the layer of dielectric material 23 by deposition and photolitho-etching of the metallic layer (see FIG. 3C).

Figure 3A:
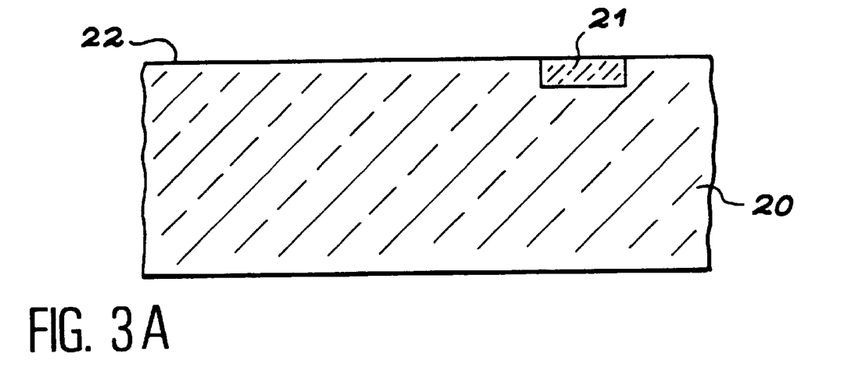
FIGS. 3A, 3B, 3C, 3D, and 3E show the different steps in a third embodiment of this invention.
Figure 3B:
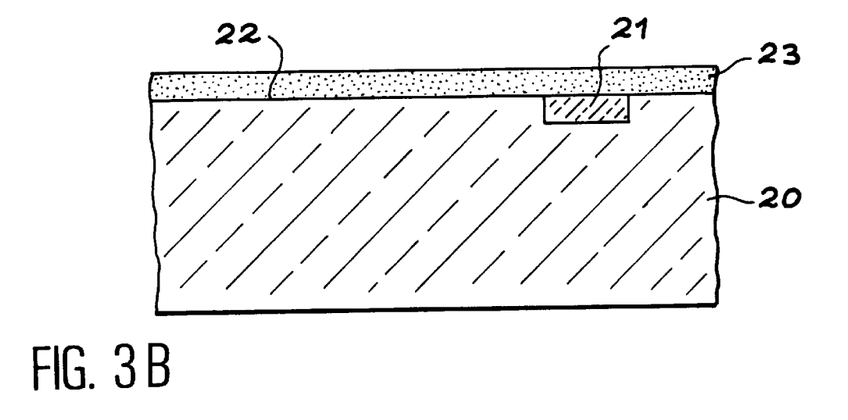
Figure 3C:
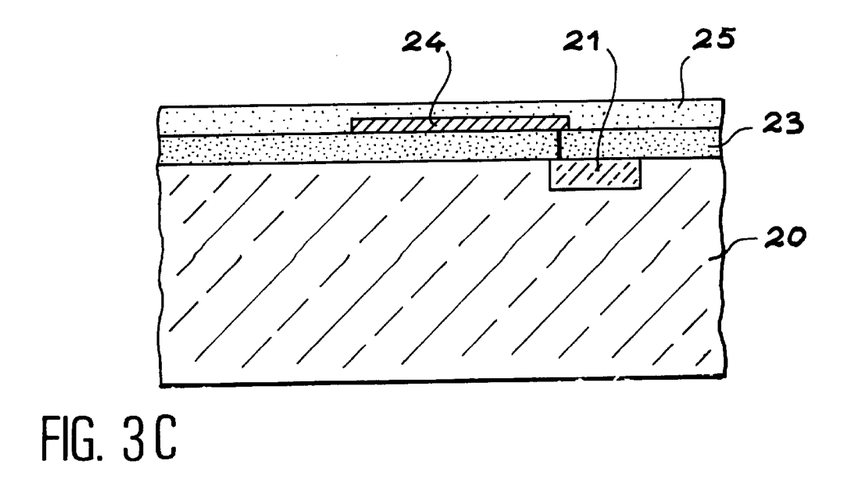

The upper face of the stacked structure as shown in FIG. 3C is then prepared to make it compatible for bonding with another substrate. For example, the structure can be made plane. This operation may consist of depositing a silica layer 25 on the face concerned, and then polishing this layer 25 by mechanical-chemical polishing.

Figure 3D:
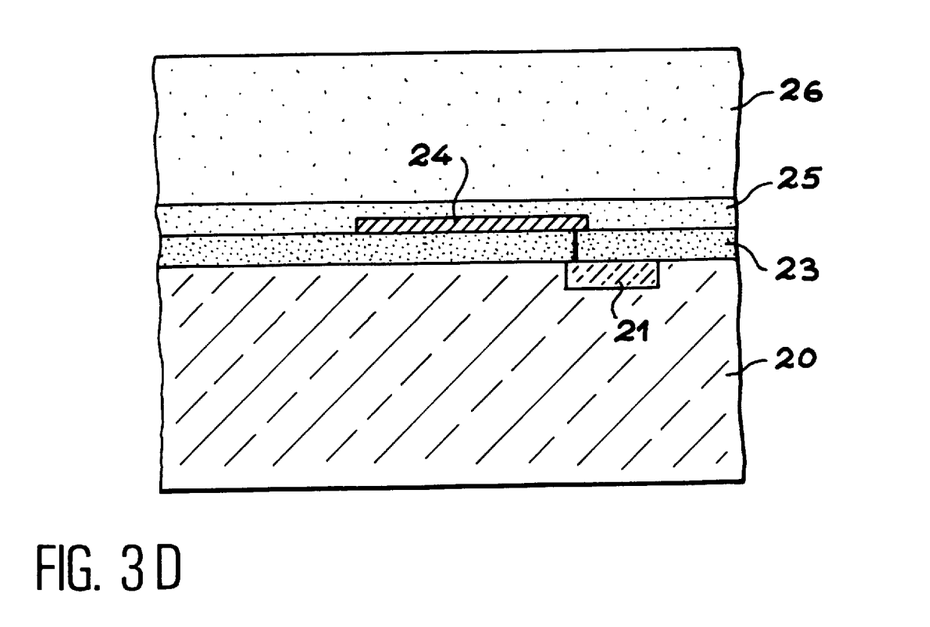

The upper face of the layer 25 is then bonded on a substrate made of an insulating material 26 (see FIG. 3D). This substrate 26 may advantageously be made of quartz, silica, glass or sapphire. Bonding may be done by molecular bonding.

Figure 3E:
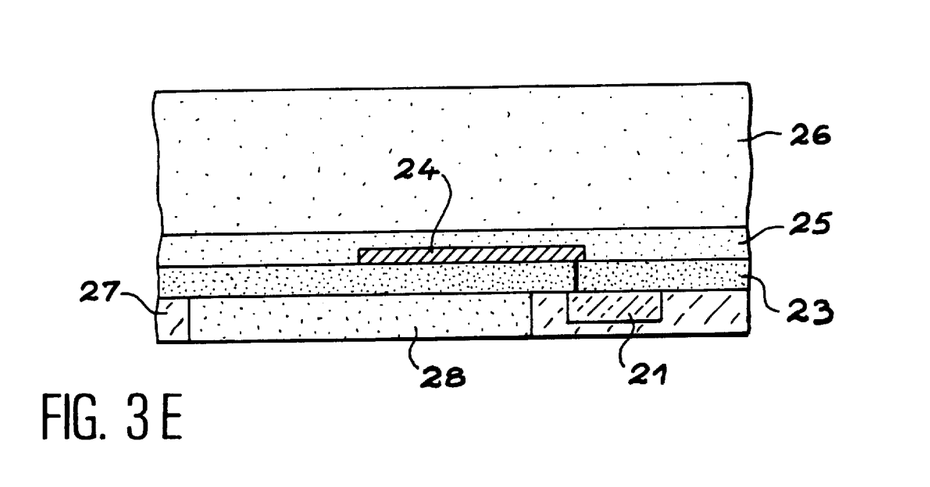

The substrate 20 is then largely eliminated, for example by grinding or polishing. This elimination is stopped before reaching the active component 21 as shown in FIG. 3E. Therefore in practice, it is the surface layer 27 in which the active component was made, that remains. The active component 21 is covered by a thin layer of the initial substrate material.

In this embodiment, the part of the surface layer away from the active component may be kept as is. It may also be made insulating as shown in FIG. 3E, in which one area 28 of this surface layer has been made insulating, for example by etching and formation of an insulator, by oxidation, or by localized particle bombardment.

This third embodiment results in a presentation of components in the upside down direction to the normal direction. The fourth embodiment which will now be described with reference to FIGS. 4A and 4B will give components in the normal direction.

The first steps in the fourth embodiment are identical to the steps in the third mode described above. Therefore, it is assumed that a structure like that described in FIG. 3E is available.

Figure 4A:
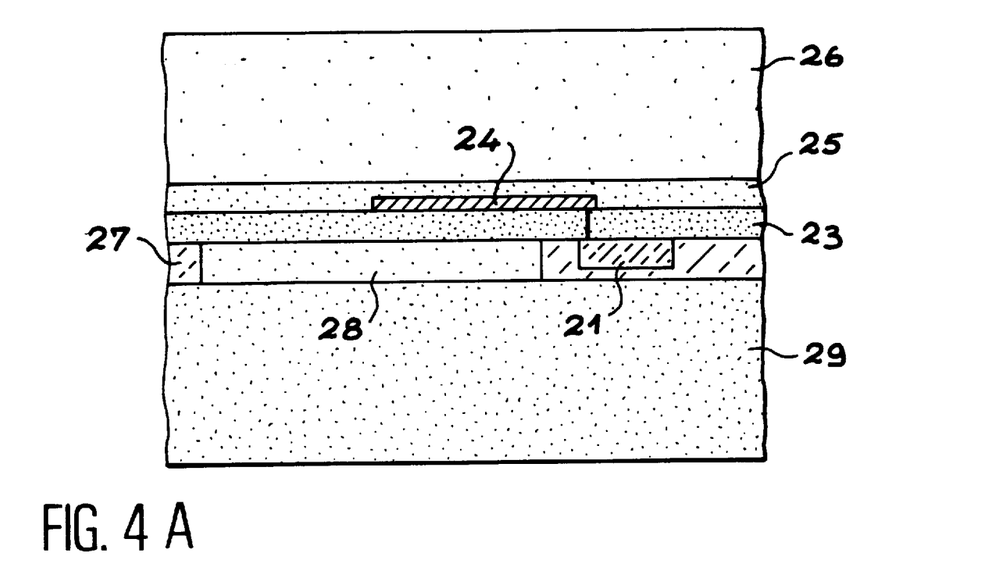
FIGS. 4A to 4B show the different steps in a fourth embodiment of the invention.

FIG. 4A shows that the surface layer was bonded to a support substrate 29 made of an insulating material. According to this fourth embodiment, the a substrate 26 is not necessarily insulating. It may be made of a semiconducting material.

Figure 4B:
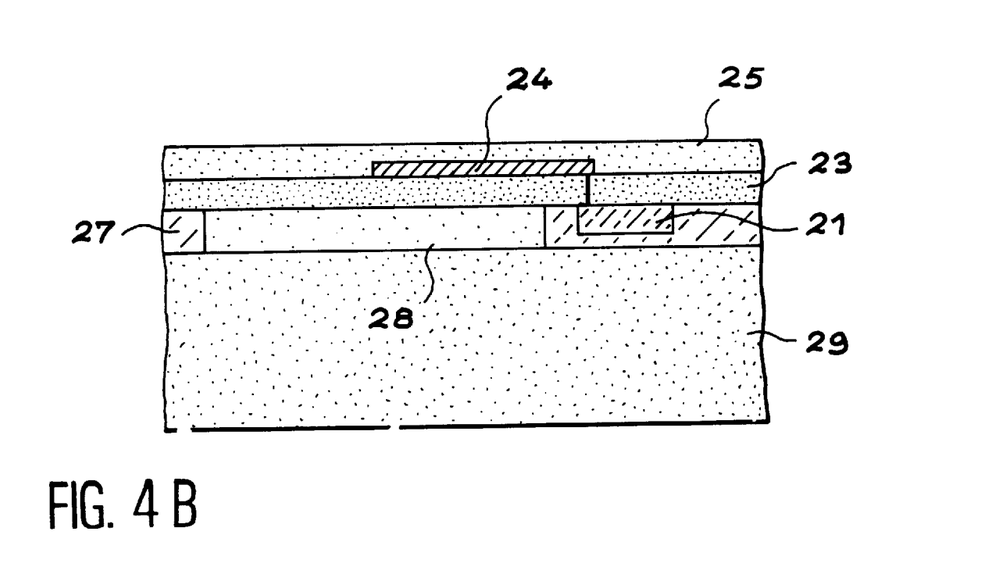

FIG. 4B shows the structure obtained after elimination of substrate 26. This substrate may be eliminated using techniques described above.

This invention has the following advantages compared with prior standard practice.

The passive components made are placed on top of an insulating substrate without the presence of subjacent conducting layers or with the presence of a thin semiconducting layer. The invention shares this advantage with the Silicon On Sapphire (SOS) technique. Losses and coupling effects through the substrate are completely eliminated or strongly reduced, therefore so that it becomes possible to make high performance hyperfrequency circuits, and to add any required electronic function without the risk of coupling and interference.

Components are initially made on a substrate using normal techniques. In particular, there is no risk of breakage or pollution related to the substrate, unlike the case of the SOS. The active layer is only transferred onto an insulating substrate after the end of the component manufacturing cycle. The use of Silicon On Insulator techniques is also preferred for making fast and low consumption circuits, which is very advantageous for portable electronic applications.

Low cost insulated substrates with a diameter compatible with the diameter of silicon wafers like lenses for electronic applications, can be used.

The additional cost necessary to implement the invention is low compared with the cost of manufacturing silicon circuits.

What is claimed is:

1. Process for the manufacture of at least one electronic structure comprising at least one active component and at least one passive component or element on a support substrate made of an insulating material, characterized in that it comprises the following steps:
   - make the active component in a surface layer made of semiconducting material from an initial substrate comprising a wafer of semiconducting material supporting the said surface layer,
   - make electrical insulation areas capable of insulating the passive component or element from the active component,
   - make the passive component or element on and/or in the electrical insulation areas,
   - prepare the surface of the initial substrate face with the said electronic structure to make this face compatible for bonding with another substrate by molecular bonding,
   - perform the said bonding, the other substrate being the said support substrate made of an insulating material,
   - eliminate all or part of the wafer made of semiconducting material.

2. Process according to claim 1, characterized in that the initial substrate also comprises an insulating layer between the wafer made of semiconducting material and the surface layer.

3. Process according to claim 2, characterized in that the electrical insulation areas are obtained by eliminating the surface layer, except for the area in which the said active component is formed, and by replacing it by a dielectric material.

4. Process according to claim 1, characterized in that the electrical insulation areas are obtained by oxidation of the surface layer, except for the area in which the said active component is formed.

5. Process according to claim 1, characterized in that the electrical insulation areas are obtained by bombardment of the surface layer by particles, except for the area in which the said active component is formed, this bombardment by particles making the semiconducting material insulating.

6. Process according to claim 5, characterized in that manufacture of the electrical insulation areas includes the formation of an insulating layer.

7. Process according to claim 1, characterized in that manufacture of the electrical insulation areas includes the formation of an insulating layer.

8. Process according to claim 7, characterized in that the passive component or element is made by deposition and photolitho-etching of the metallic layer.

9. Process according to claim 1, characterized in that the passive component or element is made by deposition and photolitho-etching of the metallic layer.

10. Process according to claim 9, characterized in that the said surface preparation includes the deposition of a planarization layer on the said face to be bonded, followed by polishing this planarization layer.

11. Process according to claim 1, characterized in that the said surface preparation includes the deposition of a planarization layer on the said face to be bonded, followed by polishing this planarization layer.

12. Process according to claim 11, characterized in that the said bonding step is done by choosing the support substrate among quartz, silica, glass and sapphire substrates.

13. Process according to claim 1, characterized in that the said bonding step is done by choosing the support substrate among quartz, silica, glass and sapphire substrates.

14. Process according to claim 13, characterized in that all or part of the wafer of semiconducting material may be eliminated using one of the following methods, or a combination of them: grinding, selective chemical etching, polishing, cleavage caused by coalescence following a heat treatment of micro-cavities generated by ionic implantation.

15. Process according to claim 1, characterized in that all or part of the wafer of semiconducting material may be eliminated using one of the following methods, or a combination of them: grinding, selective chemical etching, polishing, cleavage caused by coalescence following a heat treatment of micro-cavities generated by ionic implantation.

16. Process for the manufacture of at least one electronic structure comprising at least one active component and at least one passive component or element on a support substrate made of an insulating material, characterized in that it comprises the following steps:
    make the active component in a surface layer made of semiconducting material from an initial substrate comprising a wafer of semiconducting material supporting the said surface layer,
    make electrical insulation areas capable of insulating the passive component or element from the active component,
    make the passive component or element on and/or in the electrical insulation areas,
    bond the face of the initial substrate with the said electronic structure with a first add-on substrate,
    eliminate all or part of the wafer of semiconducting material from the initial substrate,
    prepare the surface of the wafer of semiconducting material exposed during the elimination step to make this face compatible for molecular bonding with a second add-on substrate,
    perform the said bonding of the exposed face with the second add-on substrate made of an insulating material,
    eliminate the first add-on substrate.

17. Process according to claim 16, characterized in that the initial substrate also comprises an insulating layer between the wafer made of a semiconducting material and the surface layer.

18. Process according to claim 17, characterized in that the electrical insulation areas are obtained by eliminating the surface layer, except for the area in which the said active component is formed, and by replacing it by a dielectric material.

19. Process according to claim 16, characterized in that the electrical insulation areas are obtained by oxidation of the surface layer, except for the area in which the said active component is formed.

20. Process according to claim 16, characterized in that the electrical insulation areas are obtained by bombardment of the surface layer by particles, except for the area in which the said active component is formed, this bombardment by particles making the semiconducting material insulating.

21. Process according to claim 20, characterized in that manufacture of the electrical insulation areas includes the formation of an insulating layer.

22. Process according to claim 16, characterized in that manufacture of the electrical insulation areas includes the formation of an insulating layer.

23. Process according to claim 22, characterized in that the passive component or element is made by deposition and photolitho-etching of the metallic layer.

24. Process according to claim 16, characterized in that the passive component or element is made by deposition and photolitho-etching of the metallic layer.

25. Process according to claim 24, characterized in that the all or part of the wafer of semiconducting material may be eliminated according to one of the following methods, or a combination of these methods: grinding, selective chemical etching, polishing, cleavage caused by coalescence following a heat treatment of micro-cavities generated by ionic implantation.

26. Process according to claim 16, characterized in that the all or part of the wafer of semiconducting material may be eliminated according to one of the following methods, or a combination of these methods: grinding, selective chemical etching, polishing, cleavage caused by coalescence following a heat treatment of micro-cavities generated by ionic implantation.

27. Process according to claim 26, characterized in that the said surface preparation includes the deposition of a planarization layer on each exposed face, followed by polishing of this planarization layer.

28. Process according to claim 16, characterized in that the said surface preparation includes the deposition of a planarization layer on each exposed face, followed by polishing of this planarization layer.

29. Process according to claim 28, characterized in that the said step in which the exposed face is bonded is carried out choosing a quartz, silicon, glass or sapphire substrate as the second add-on substrate.

30. Process according to claim 16, characterized in that the said step in which the exposed face is bonded is carried out choosing a quartz, silicon, glass or sapphire substrate as the second add-on substrate.

31. Process according to claim 30, characterized in that first add-on substrate may be eliminated according to one of the following methods, or a combination of these methods: grinding, selective chemical etching, polishing, cleavage caused by coalescence following a heat treatment of micro-cavities generated by ionic implantation.

32. Process according to claim 16, characterized in that first add-on substrate may be eliminated according to one of the following methods, or a combination of these methods: grinding, selective chemical etching, polishing, cleavage caused by coalescence following a heat treatment of micro-cavities generated by ionic implantation.

* * * * *